(12) United States Patent
Raina

(10) Patent No.: US 6,440,505 B1
(45) Date of Patent: *Aug. 27, 2002

(54) METHODS FOR FORMING FIELD EMISSION DISPLAY DEVICES

(75) Inventor: Kanwal K. Raina, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/707,441

(22) Filed: Nov. 6, 2000

Related U.S. Application Data

(63) Continuation of application No. 09/023,661, filed on Feb. 9, 1998, now Pat. No. 6,165,568.

(51) Int. Cl.[7] .............................................. C23C 16/34
(52) U.S. Cl. .......................... 427/579; 427/77; 427/78; 427/255.18; 427/255.394; 427/299; 427/309
(58) Field of Search ........................ 427/77, 78, 255.18, 427/255.394, 579, 299, 309

(56) References Cited

U.S. PATENT DOCUMENTS

| | | | |
|---|---|---|---|
| 3,549,411 A | * | 12/1970 | Bean et al. |
| 3,753,840 A | | 8/1973 | Plumat |
| 4,664,934 A | | 5/1987 | Ito et al. |
| 4,975,760 A | | 12/1990 | Dohjo et al. |
| 5,034,795 A | | 7/1991 | Henry |
| 5,189,551 A | * | 2/1993 | Woodard |
| 5,585,301 A | * | 12/1996 | Lee et al. |
| 5,725,957 A | | 3/1998 | Varaprasad et al. |
| 5,846,628 A | | 12/1998 | Kuroe et al. |
| 6,165,568 A | * | 12/2000 | Raina |
| 6,208,071 B1 | * | 3/2001 | Nishimura et al. |

OTHER PUBLICATIONS

Abstract: Kato, Y., et al., "Effect of Washington Methods on AMLCD Glass Substrates Treated with BHF", pp. 33–34.
Abstract: Walter, A.E., et al., "Effective Particle Removal Using an Enclosed Process Chamber for FPD Chemical Cleaning", pp. 37–39.
Textbook excerpt: Chapter Two: Display Manufacturing, "Liquid Crystal Flat Panel Displays", (1993) pp. 63–66, Van Hostrand Reinhold.

* cited by examiner

Primary Examiner—Timothy Meeks
(74) Attorney, Agent, or Firm—Wells St. John P.S.

(57) ABSTRACT

The invention includes methods of treating sodalime glass surfaces for deposition of silicon nitride and methods of forming field emission display devices. In one aspect, the invention includes a method of treating a sodalime glass surface for deposition of silicon nitride comprising: a) cleaning a surface of the glass with detergent; and b) contacting the cleaned surface with a solution comprising a strong oxidant to remove non-silicon-dioxide materials from the surface and from a zone underlying and proximate the surface. In another aspect, the invention includes a method of treating a sodalime glass surface region for deposition of silicon nitride comprising: a) providing a sodalime glass surface region having a first concentration of an undesired chemical; b) contacting the sodalime glass surface region with a detergent solution; c) agitating the detergent solution across the sodalime glass surface region; d) removing the detergent solution from the surface region; e) after removing the detergent solution, contacting the sodalime glass surface region with a sulfuric acid solution; and f) removing the sulfuric acid solution from the sodalime glass surface region; wherein, after removing the sulfuric acid solution, the sodalime glass surface region comprises less than the first concentration of the undesired chemical.

22 Claims, 3 Drawing Sheets

METHODS FOR FORMING FIELD EMISSION DISPLAY DEVICES

RELATED PATENT DATA

This patent resulted from a continuation application of U.S. patent application Ser. No. 09/023,661, filed on Feb. 9, 1998, now U.S. Pat, No. 6,165,568.

TECHNICAL FIELD

The invention encompasses methods of depositing silicon nitride on sodalime glass surfaces and to methods of forming field emission display devices.

BACKGROUND OF THE INVENTION

Flat-panel displays are widely used to visually display information where the physical thickness and bulk of a conventional cathode ray tube is unacceptable or impractical. Portable electronic devices and systems have benefitted from the use of flat-panel displays, which require less space and result in a lighter, more compact display system than provided by conventional cathode ray tube technology.

A particular type of flat-panel display is, the field emission flat panel display. In a field emission flat-panel display, an electron emitting cathode plate is separated from a display face or faceplate at a relatively small, uniform distance. The intervening space between these elements is evacuated. Field emission displays have the outward appearance of a CRT except that they are very thin. While being simple, they are also capable of very high resolutions. In some cases, they can be assembled by use of technology already used in integrated circuit production.

Field emission flat-panel displays utilize field emission devices, in groups or individually, to emit electrons that energize a cathodoluminescent material deposited on a surface of a viewing screen or display faceplate. The emitted electrons originate from an emitter or cathode electrode at a region of geometric discontinuity having a sharp edge or tip. Electron emission is induced by application of potentials of appropriate polarization and magnitude to the various electrodes of the field emission display device, which are typically arranged in a two-dimensional matrix array.

A field emission display device 10 is illustrated schematically in FIG. 1. Device 10 comprises a faceplate 12 comprising a transparent conductor. Underlying faceplate 12 are phosphor dots 14. A spacer 16 is provided to space faceplate 12 from a series of column electrodes 18 and emitters 20. Column electrodes 18 and emitters 20 overlay row electrodes 22, which in turn overlay a baseplate 24.

Baseplate 24 is typically made out of sodalime glass, and typically comprises a layer of silicon nitride formed between baseplate 24 and emitters 20. The silicon nitride is deposited to provide a buffer layer between glass and subsequent layers. This results in better stress control and adhesion between the subsequent metal, emitter and grid layers. Another advantage of this buffer layer is that it can cap or prevent impurities within the glass from entering into other parts of the device structure. Emitters 20 are thus at least partially supported by the layer of silicon nitride. The silicon nitride can be deposited by a number of conventional methods, including, for example, a plasma enhanced chemical vapor deposition process utilizing silane and ammonium gasses. An example deposition method comprises placing a glass substrate within a reactor. The pressure within the reactor is maintained at about 1000 mTorr, and a power within the reactor is maintained at about 500 watts. A mixture of $SiH_4$ and $NH_3$ is flowed into the reactor. A flow rate of the $SiH_4$ is 100 standard cubic centimeters (sccm). A flow rate of the $NH_3$ is 450 sccm. The deposited silicon nitride disadvantageously has a tensile stress which renders the silicon nitride prone to scratching and cracking.

It would be desirable to develop alternative methods of forming a silicon nitride coated baseplate wherein the silicon nitride does not have a tensile stress.

SUMMARY OF THE INVENTION

The invention encompasses methods of treating sodalime glass surfaces for deposition of silicon nitride and methods of forming field emission display devices.

In one aspect, the invention encompasses a method of treating a sodalime glass surface for deposition of silicon nitride. A surface of the glass is cleaned with a detergent and contacted with a solution comprising a strong oxidant to remove non-silicon-dioxide materials from the surface and from a zone underlying and proximate the surface.

In another aspect, the invention encompasses a method of depositing silicon nitride. A surface of a sodalime glass substrate is contacted with a solution comprising sulfuric acid and hydrogen peroxide to remove non-silicon-dioxide materials from the surface and from a zone underlying and proximate the surface. The surface is then exposed to a mixture of $SiH_4$, $NH_3$ and $H_2$ to deposit silicon nitride on the surface.

In another aspect, the invention encompasses a method of depositing silicon nitride on a sodalime glass surface. A sodalime glass surface is provided and contacted with a detergent solution. The detergent solution is agitated across the sodalime glass surface and then removed from the sodalime glass surface by rinsing it in deionized water at about 80° C. After removing the detergent solution, the sodalime glass surface is contacted with a sulfuric acid solution to remove nonsilicon-dioxide materials from the surface and from a zone underlying and proximate the surface. The sulfuric acid solution is then removed from the sodalime; glass surface. After removing the sulfuric acid solution, nitride is deposited on the sodalime glass surface.

In another aspect, the invention encompasses a method of forming a field emission display device. A base plate is formed. The forming of the base plate comprises the following steps. A base plate substrate is provided. The base plate substrate comprises a sodalime glass surface having a first concentration of an undesired chemical. The sodalime glass surface is contacted with a detergent solution. The detergent solution is agitated across the sodalime glass surface and then removed. After removing the detergent solution, the sodalime glass surface is contacted with a sulfuric acid solution to extract at least some of the undesired chemical from the sodalime glass surface and from a zone underlying and proximate the surface. The sulfuric acid solution and the extracted undesired chemical are removed from the sodalime glass surface. After removing the sulfuric acid solution, the sodalime glass surface comprises less than the first concentration of the undesired chemical. After removing the sulfuric acid solution, depositing nitride on the sodalime glass surface to form a base plate. Emitters, at least partially supported by the silicon nitride of the base plate, are formed.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

As referred to above in the "Background Of The Invention", conventional silicon nitride layers deposited on sodalime glass substrates have tensile stress and are prone to scratching and cracking. In accordance with the present invention, it is recognized that a silicon nitride layer will have a low compressive stress, rather than a tensile stress, if the silicon nitride is formed to be denser than the conventional silicon nitride applied to sodalime glass. A method of forming denser silicon nitride is to deposit silicon nitride with a plasma enhanced chemical vapor deposition process utilizing silane, hydrogen and ammonium gasses. An example deposition method comprises placing a glass substrate within a reactor. The pressure within the reactor is maintained at about 1000 mTorr, and a power within the reactor is maintained at about 500 watts. A mixture of $SiH_4$, $H_2$ and $NH_3$ is flowed into the reactor. A flow rate of the $SiH_4$ is about 100 standard cubic centimeters (sccm). A flow rated of the $H_2$ is from about 650 sccm to about 750 sccm, and preferably about 730 sccm. And, a flow rate of the $NH_3$ is about 450 sccm.

Silicon nitride deposited by the above example process of the present invention is denser than silicon nitride deposited by a conventional process as evidenced by a decreased etch rate of the silicon nitride deposited by the example process of the present invention. An etch rate of silicon nitride deposited by the example process of the present invention is 750 angstroms/minute with a buffered oxide etchant comprising ammonium fluoride and HF. An etch rate of silicon nitride deposited by a conventional method is 2200 angstroms/minute under identical conditions.

Unfortunately, silicon nitride layers chemical vapor deposited onto sodalime glass with $SiH_4$, $H_2$ and ammonia are frequently and undesirably cloudy. In accordance with the present invention, it is recognized that the cloudiness and imperfections of such silicon nitride layers is caused by non-silicon-dioxide materials present in the sodalime glass. Accordingly, the present invention encompasses a treatment method which removes non-silicon-dioxide materials from proximate a sodalime glass surface prior to formation of a silicon nitride layer on the surface.

Figure 2:
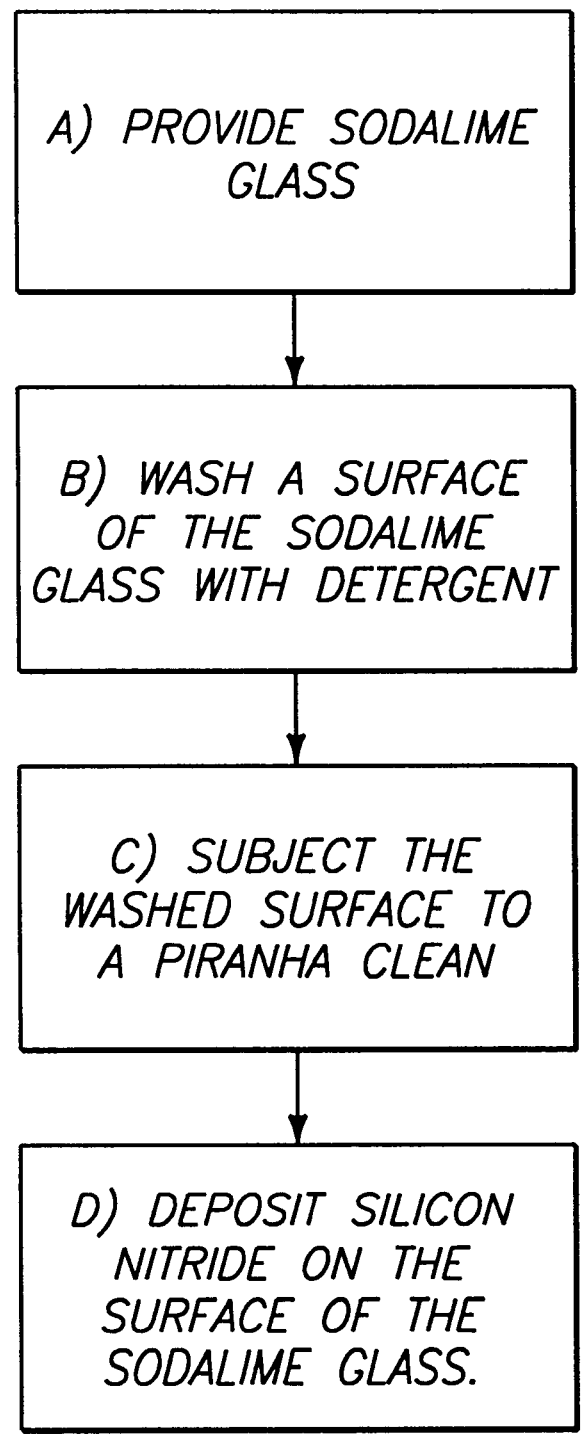
FIG. 2 is a block diagram of a process of the present invention.

An embodiment of the present invention is illustrated in a block diagram shown in FIG. 2. Referring to FIG. 2, the present invention encompasses providing a sodalime glass substrate. The sodalime glass substrate may be configured, for example, for incorporation as a baseplate in a field emission display device. Sodalime glass generally comprises about 75 weight percent of silicon dioxide and about 25 weight percent of a combination of one or more of sodium oxide, potassium oxide, magnesium oxide, aluminum oxide, iron oxide and calcium oxide. As part of the present invention it is recognized that the non-silicon-dioxide materials of sodalime glass can adversely affect deposition of silicon nitride. Accordingly, the present invention encompasses a pretreatment step which can reduce the amount of non-silicon-dioxide materials at a surface of a sodalime glass prior to deposition of silicon nitride.

In the block diagram of FIG. 2, a pretreatment of the present invention comprises the two steps indicated as steps B and C. Step B comprises washing a surface of the sodalime glass with a detergent solution. A suitable detergent has been found to be DNS, TS-400G, manufactured by Dianippon Screen, Japan. The detergent solution may be vigorously applied to the sodalime glass surface by either mechanical agitation or by ultrasonically vibrating the detergent solution across the glass surface. Methods for agitation of a detergent solution against a glass surface and for ultrasonically vibrating a detergent solution across a glass surface are known to persons of ordinary skill in the art.

After application of the detergent to the glass surface, the detergent can be removed from the sodalime glass surface (in a step which is not shown in FIG. 2) by conventional methods, such as by a deionized water wash and an air dry.

Referring to step C of FIG. 2, the washed surface of the sodalime glass is subjected to a piranha clean. Such piranha clean will comprise exposing the sodalime glass surface to a solution comprising sulfuric acid and hydrogen peroxide. A preferred concentration of the sulfuric acid and hydrogen peroxide within the piranha clean is 100 parts of sulfuric acid per part of hydrogen peroxide (by volume). As will be recognized by persons of ordinary skill in the art, both sulfuric acid and hydrogen peroxide are generally known to be strong oxidants. Accordingly, the piranha clean is a strongly oxidizing solution. Such strongly oxidizing solution can, for example, oxidize organic materials to assist in removing the materials from the sodalime glass surface. Also, an effect of the piranha clean is understood to be the removal of alkaline metals, aluminum and iron from the surface of a sodalime glass.

Although it is preferred to subject a sodalime glass to a solution comprising both sulfuric acid and hydrogen peroxide, it has been found that suitable results can also be obtained utilizing simply sulfuric acid. As will be recognized by persons with ordinary skill in the art, sulfuric acid is considered a strong acid. Accordingly, the present invention encompasses exposing a sodalime surface to a strong acid.

Preferably, the temperature of at least one of the exposed sodalime glass surface, and of the oxidizing solution, is controlled during exposure of the sodalime glass surface to the oxidizing solution. The controlled temperature will preferably be from about 20° C. to about 100° C., and will most preferably be about 85° C. It has been found experimentally that at temperatures of 85° C. effective results can be achieved after only 15 minutes of treatment of the sodalime glass surface with the oxidizing solution. It has also been found that temperatures above 100° C. are typically not desired due to vaporization of the acid in the oxidizing solution. The pressure during exposure of a sodalime glass surface to the oxidizing solution is preferably about one atmosphere. The temperature will preferably be controlled during the majority of a period of time that the sodalime glass surface is exposed to the oxidizing solution. It is recognized that unless the sodalime surface and the oxidizing solution are preheated, there would likely be a short period of time during initial exposure of the oxidizing solution and the sodalime glass surface when one or both are not at the desired controlled temperature. This lack of desired temperature during initial exposure is not expected to significantly adversely affect methods of the present invention.

After application of the piranha cleaning solution to the glass surface, the solution can be removed from the surface (in a step which is not shown in FIG. 2) by conventional methods, such as by a deionized water wash and an air dry.

Referring to step D of FIG. 2, a silicon nitride layer is deposited on the treated surface of the sodalime glass. The silicon nitride layer can be deposited by conventional methods, or by plasma enhanced chemical vapor deposition utilizing silane, ammonia and hydrogen gasses.

Figure 3:
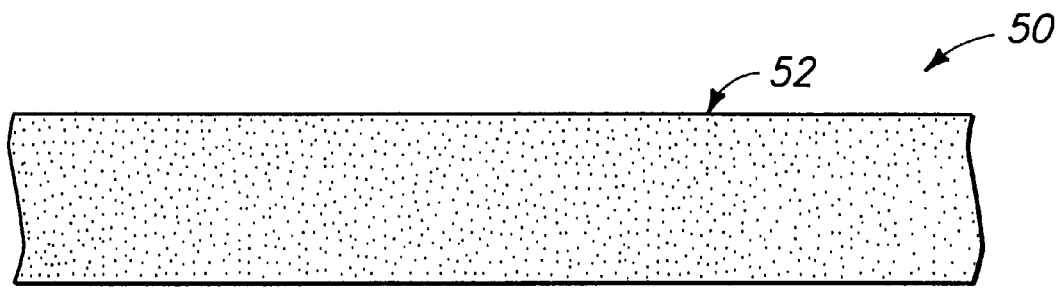
FIG. 3 is a schematic cross-sectional view of a sodalime glass fragment being treated according to a method of the present invention.
Figure 4:
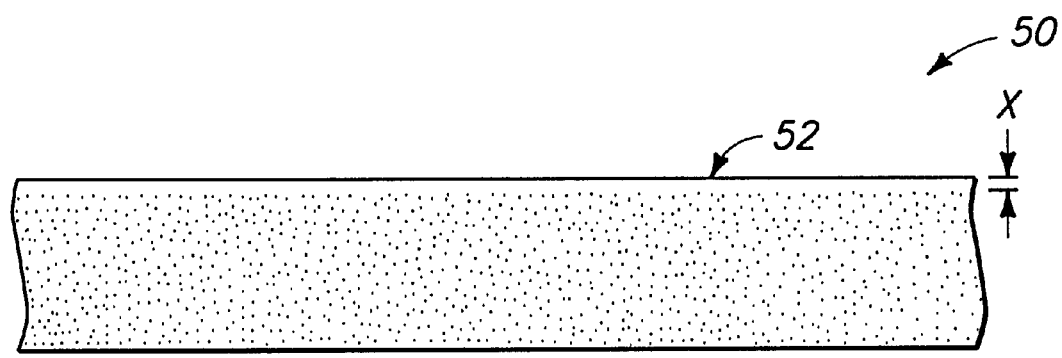
FIG. 4 is a schematic cross-sectional view of the FIG. 3 sodalime glass fragment at a processing step subsequent to that of FIG. 3.
Figure 5:
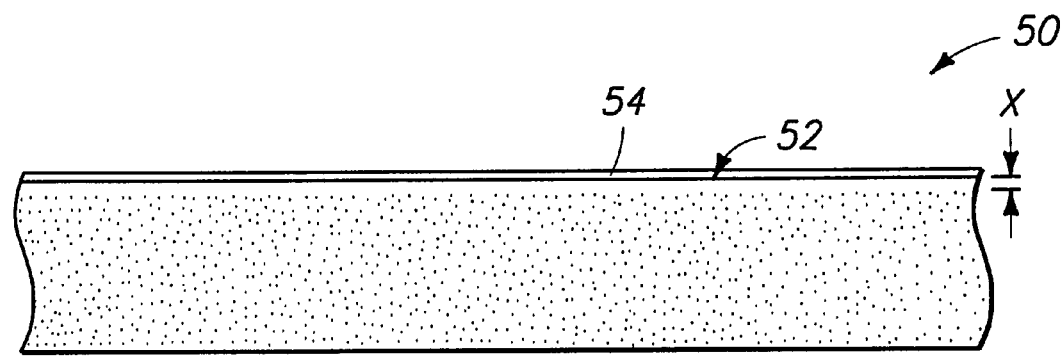
FIG. 5 is a schematic cross-sectional view of the FIG. 3 sodalime glass fragment at a processing step subsequent to that of FIG. 4.

A process of the present invention is next described schematically with references to FIGS. 3–5. Referring to FIG. 3, a sodalime glass substrate 50 is illustrated. Substrate 50 comprises a surface 52 and a number of impurities (shown as stippling) beneath surface 52. For purposes of the following discussion, the impurities comprise the non-silicon-dioxide components of sodalime glass substrate 50. Such impurities can comprise, for example, oxygen, metal ions, alkali metal ions, and alkaline metal ions. More specifically, the non-silicon-dioxide materials of a sodalime glass typically comprise one or more elements selected from the group consisting of Na, K, O, Ca, Mg, Sn, Fe, and Al. In accordance with the present invention, it is recognized that, such elements may constitute undesired chemicals at a sodalime surface in the context of attempting to deposit silicon nitride on such surface.

Figure 1:
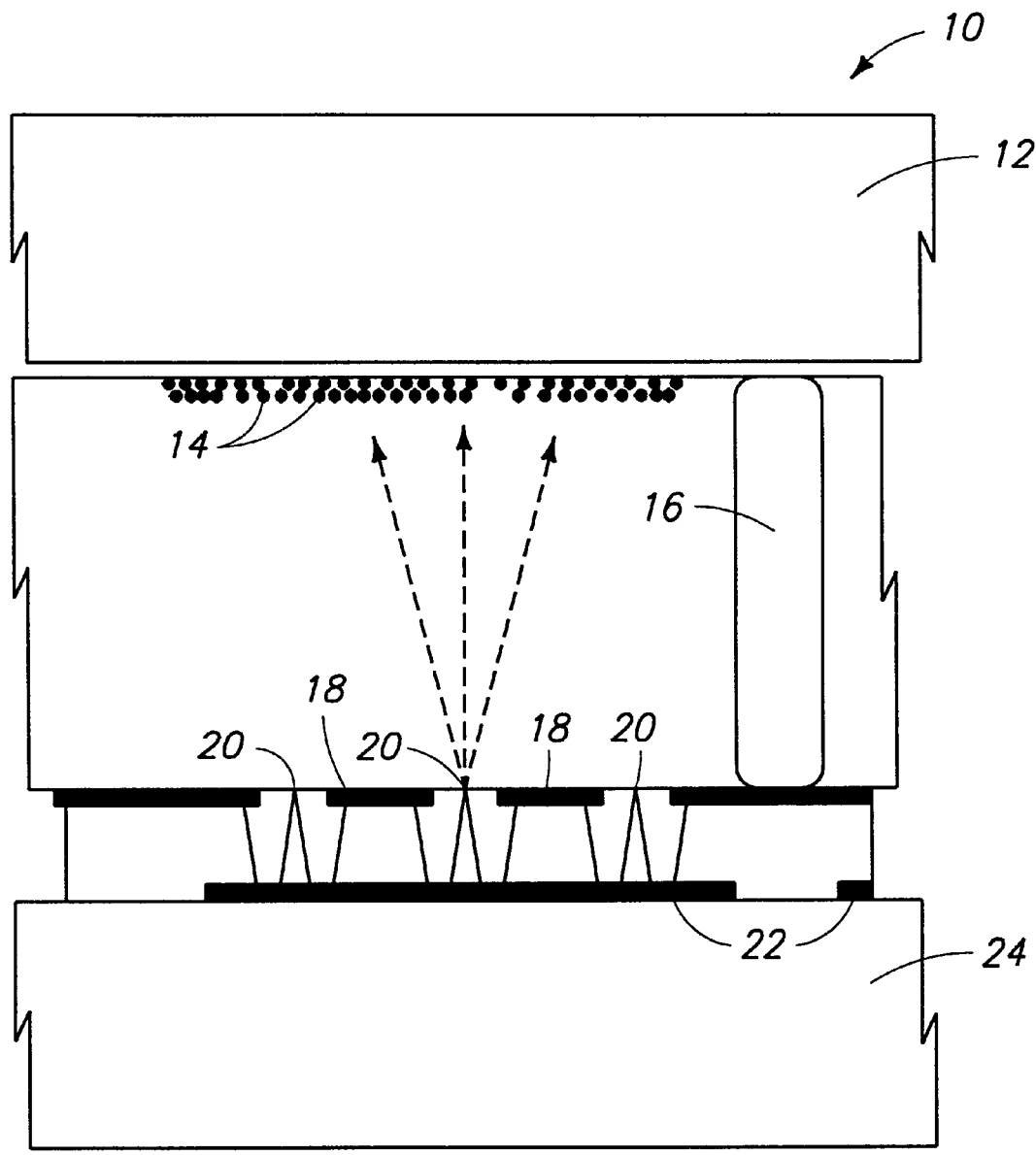
FIG. 1 is a schematic cross-sectional view of a prior art field emission display device.

Referring to FIG. 4, the sodalime fragment of FIG. 3 is shown after being subjected to a pretreatment step of the present invention. As discussed above with reference to FIG. 1, such pretreatment step comprises exposure of surface 52 to a piranha clean, and preferably also comprises exposure of surface 52 to a detergent-based clean in advance thereof. As shown in FIG. 4, the pretreatment steps of the present invention advantageously remove impurities from surface 52 and from a zone "X" underlying and proximate surface 52. Zone "X" and surface 52 together comprise a surface region.

Referring to FIG. 5, a silicon nitride layer 54 is deposited over surface 52. In accordance with the present invention, it is recognized that depositing silicon nitride layer 54 over surface 52 after the above-discussed pretreatment steps can advantageously improve clarity of the silicon nitride layer. It is also recognized that depositing silicon nitride layer 54 over surface 52 after the above-discussed pretreatment steps can advantageously decrease surface imperfections within the silicon nitride layer relative to deposition of a silicon nitride layer without utilizing such pretreatment steps.

After provision of silicon nitride layer 54, sodalime glass substrate 50 can be incorporated, for example, into a field emission display device (such as that shown in FIG. 1) as a baseplate.

Characterization of silicon nitride layers deposited by plasma enhanced chemical vapor deposition utilizing $SiH_4$, $H_2$ and ammonia, with and without a pretreatment of the present invention, has been done utilizing XPS (X-ray photoelectron spectroscopy), and SIMS (secondary ion mass spectrometry). The analyses indicate that the pretreatment of the present invention can significantly reduce the incorporation of impurities such as sodium, calcium, potassium, magnesium, aluminum, carbon, fluorine, chlorine, and oxygen in a silicon nitride layer formed by plasma enhanced chemical vapor deposition utilizing $SiH_4$, $H_2$ and ammonia. Such reduction of contaminating materials within a silicon nitride layer is found to improve the clarity of the layer and to also improve surface characteristics of the layer. Such improvement in clarity and surface characteristics improves a suitability of the silicon nitride layers for utilization in field emission display devices.

Characterization of silicon nitride layers deposited by plasma enhanced chemical vapor deposition utilizing $SiH_4$, $H_2$ and ammonia, with and without a pretreatment of the present invention, has also been done utilizing AFM (atomic force microscopy). Such characterization indicates that a surface roughness of a silicon nitride layer deposited after pretreatment of a sodalime glass in accordance with the present invention is about 100 Angstroms. In contrast, a silicon nitride layer deposited on a sodalime glass without such pretreatment has a surface roughness of about 2 microns. The silicon nitride layer formed after a pretreatment step of the present invention thus has a decreased surface roughness relative to a silicon nitride layer formed without such pretreatment. Such decreased surface roughness improves a suitability of the silicon nitride layer formed after the pretreatment for utilization in field emission display devices relative to the silicon nitride layer formed without the pretreatment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a field emission display device comprising:

providing a base plate comprising sodalime glass and a non-silicon-dioxide material and having a surface region including an underlying zone proximate an outer surface of the surface region;

treating the sodalime glass surface region with an acid for a time sufficient to remove at least some of the non-silicon-dioxide material from the underlying zone; and depositing silicon nitride on the outer surface.

2. The method of claim 1 further comprising forming emitters at least partially supported by the silicon nitride.

3. The method of claim 1 wherein the depositing comprises chemical vapor depositing utilizing $SiH_4$, $H_2$, and $NH_3$.

4. The method of claim 1 wherein the treating sufficiently reduces the presence of the non-silicon-dioxide material so as to reduce cloudiness of the silicon nitride compared to cloudiness of silicon nitride deposited on an outer surface of a surface region not so treated.

5. The method of claim 1 wherein the surface region is treated for at least 15 minutes.

6. The method of claim 1 wherein the surface region is treated for less than about 20 minutes and wherein the surface region is maintained at a temperature of less than about 100° C. during the majority of the time that the surface region is treated.

7. The method of claim 1 wherein the surface region is maintained at a temperature of from about 20° C. to about 100° C. during the treating time.

8. The method of claim 1 wherein the treating comprises contacting the outer surface with a solution comprising a strong acid and, optionally, an additional oxidant.

9. The method of claim 8 wherein the solution comprises hydrogen peroxide and sulfuric acid.

10. The method of claim 8 wherein the solution comprises hydrogen peroxide and about 100 parts of sulfuric acid per part of hydrogen peroxide.

11. The method of claim 8 wherein the outer surface is contacted with the solution for less than about 20 minutes and wherein the solution is maintained at a temperature of less than about 100° C. during the majority of the time that the surface region is in contact with the solution.

12. The method of claim 8 wherein the solution is maintained at a temperature of from about 20° C. to about 100° C. during the majority of the treating time.

13. The method of claim 1 wherein the non-silicon-dioxide material comprises at least one of an alkali metal ion and an alkaline metal ion.

14. The method of claim 1 wherein the non-silicon-dioxide material comprises at least one of Na, K, O, Ca, Mg, Sn, Fe, and Al.

15. A method of forming a field emission display device comprising:
providing a base plate comprising a sodalime glass surface region having a first concentration of an undesired chemical and including an underlying zone proximate an outer surface of the surface region;
contacting the sodalime glass surface region with a detergent solution;
agitating the detergent solution across the sodalime glass surface region;
removing the detergent solution from the sodalime glass surface region,
after removing the detergent solution, treating the surface region with an acid to extract at least some of the undesired chemical from the underlying zone, the sodalime glass surface region comprising less than the first concentration of the undesired chemical after the treating; and
depositing silicon nitride on the outer surface.

16. The method of claim 15 further comprising forming emitters at least partially supported by the silicon nitride.

17. The method of claim 15 wherein the treating comprises contacting the outer surface with a solution comprising a strong acid and, optionally, an additional oxidant.

18. The method of claim 17 wherein the solution comprises hydrogen peroxide and sulfuric acid.

19. The method of claim 15 wherein the undesired chemical comprises at least one of Na, K, O, Ca, Mg, Sn, Fe, and Al.

20. A method of forming a field emission display device comprising:
providing a base plate comprising sodalime glass and an undesired material comprising at least one of Na, K, O, Ca, Mg, Sn, Fe, and Al, the base plate having a surface region including an underlying zone proximate an outer surface of the surface region; and
contacting the outer surface with a solution comprising sulfuric acid and removing at least some of the undesired material from the underlying zone, the underlying zone comprising less of the undesired material after the treating.

21. The method of claim 20 wherein the outer surface is contacted with the solution for at least 15 minutes.

22. The method of claim 20 wherein the outer surface is contacted with the solution for less than about 20 minutes and wherein the surface region is maintained at a temperature of less than about 100° C. during the majority of the time that the surface region is treated.

* * * * *